(12) United States Patent
Kasahara et al.

(10) Patent No.: US 11,647,584 B2
(45) Date of Patent: May 9, 2023

(54) CIRCUIT BOARD, AND ELECTRONIC DEVICE

(71) Applicant: SHINKO ELECTRIC INDUSTRIES CO., LTD., Nagano (JP)

(72) Inventors: Tetsuichiro Kasahara, Nagano (JP); Tsukasa Nakanishi, Nagano (JP); Koji Watanabe, Nagano (JP); Jun Izuoka, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 17/524,328

(22) Filed: Nov. 11, 2021

(65) Prior Publication Data
US 2022/0159831 A1    May 19, 2022

(30) Foreign Application Priority Data

Nov. 13, 2020 (JP) .............................. JP2020-189772

(51) Int. Cl.
*H05K 1/05* (2006.01)
*H05K 1/11* (2006.01)
*H05K 1/18* (2006.01)

(52) U.S. Cl.
CPC .............. *H05K 1/056* (2013.01); *H05K 1/115* (2013.01); *H05K 1/185* (2013.01)

(58) Field of Classification Search
CPC ........ H05K 1/111; H05K 1/113; H05K 1/115; H05K 1/116; H05K 1/14; H05K 1/141; H05K 1/144; H05K 1/145; H05K 1/18; H05K 1/181; H05K 1/182; H05K 1/183; H05K 1/184; H05K 1/185; H05K 1/186; H05K 1/187; H05K 1/188; H05K 2201/0332; H05K 2201/0335; H05K 2201/0338; H05K 2201/0341; H05K 2201/0347; H05K 2201/0364; H05K 2201/0367; H05K 2201/0379; H05K 2201/0385; H05K 2201/09054; H05K 2201/0929; H05K 2201/09363; H05K 2201/09372; H05K 2201/094;
(Continued)

(56) References Cited

U.S. PATENT DOCUMENTS 5,780,143 A * 7/1998 Shimamoto .......... H05K 3/4069
                                                        428/209
9,837,337 B2 * 12/2017 Kobayashi .......... H01L 21/4828
(Continued)

FOREIGN PATENT DOCUMENTS

JP    2017-130493    7/2017
JP    2018-046218    3/2018

*Primary Examiner* — Hoa C Nguyen
*Assistant Examiner* — John B Freal
(74) *Attorney, Agent, or Firm* — Rankin, Hill & Clark LLP

(57) ABSTRACT

A circuit board includes a first metal layer; a second metal layer that is arranged on the first metal layer; and a sealing resin with which a space between the first metal layer and the second metal layer is filled, wherein the second metal layer includes an electrode that protrudes from an upper surface of the sealing resin and that has an end face on which an electronic part is mountable; and an interlayer connector whose upper surface is exposed in a position lower than the end face of the electrode from the upper surface of the sealing resin and that makes contact with the first metal layer.

4 Claims, 11 Drawing Sheets

(58) Field of Classification Search
CPC .......... H05K 2201/09427; H05K 2201/09472; H05K 2201/09481; H05K 2201/095; H05K 2201/09863; H05K 2201/10; H05K 2201/10272; H05K 2201/10325; H05K 2201/10333

See application file for complete search history.

(56) References Cited

U.S. PATENT DOCUMENTS

| | | |
|---|---|---|
| 10,096,539 B2 | 10/2018 | Kasahara et al. |
| 2008/0202803 A1* | 8/2008 | Nagase ................ H05K 3/4007 174/262 |
| 2012/0111607 A1* | 5/2012 | Okabe .................... H05K 1/116 174/250 |
| 2017/0207148 A1* | 7/2017 | Kasahara .......... H01L 23/49537 |
| 2020/0365516 A1* | 11/2020 | Kasahara ................ H01L 25/16 |

* cited by examiner

CIRCUIT BOARD, AND ELECTRONIC DEVICE

CROSS-REFERENCE TO RELATED APPLICATION

This application is based upon and claims the benefit of priority of the prior Japanese Patent Application No. 2020-189772, filed on Nov. 13, 2020, the entire contents of which are incorporated herein by reference.

FIELD

The embodiment discussed herein is related to a circuit board, an electronic device and a method of manufacturing a circuit board.

BACKGROUND

There have been circuit boards incorporating a part, such as an IC chip. Such a circuit board is, for example, configured by mounting a part, such as an IC chip, in an interposed manner between two metal layers and sealing the part with resin.

Patent Literature 1: Japanese Laid-open Patent Publication No. 2017-130493

In a circuit board in which a part is mounted in an interposed manner between two metal layers, in general, an interlayer connector that connects the two metal layers and electrodes on which an external part, such as inductor, is mountable protrude from a sealing resin covering the mounted part. For this reason, when an external part is mounted on the electrodes of the circuit board, the external part and the interlayer connector sometimes get close to each other. For example, when the interlayer connector is formed in a position between electrodes that are adjacent to each other, the external part that is mounted on the electrodes adjacent to each other and the interlayer connector get close to each other. When the external part and the interlayer connector get close to each other, the possibility that the external part and the interlayer connector would make contact with each other increases. As a result, there is a risk that a short circuit between the interlayer connector and the external part would occur.

SUMMARY

According to an aspect of an embodiment, a circuit board includes a first metal layer; a second metal layer that is arranged on the first metal layer; and a sealing resin with which a space between the first metal layer and the second metal layer is filled, wherein the second metal layer includes an electrode that protrudes from an upper surface of the sealing resin and that has an end face on which an electronic part is mountable; and an interlayer connector whose upper surface is exposed in a position lower than the end face of the electrode from the upper surface of the sealing resin and that makes contact with the first metal layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An embodiment of a circuit board, an electronic device, and a method of manufacturing a circuit board disclosed herein will be described in detail below based on the accompanying drawings. The embodiment does not limit the disclosed technique.

Embodiment

Configuration of Circuit Board

Figure 1:
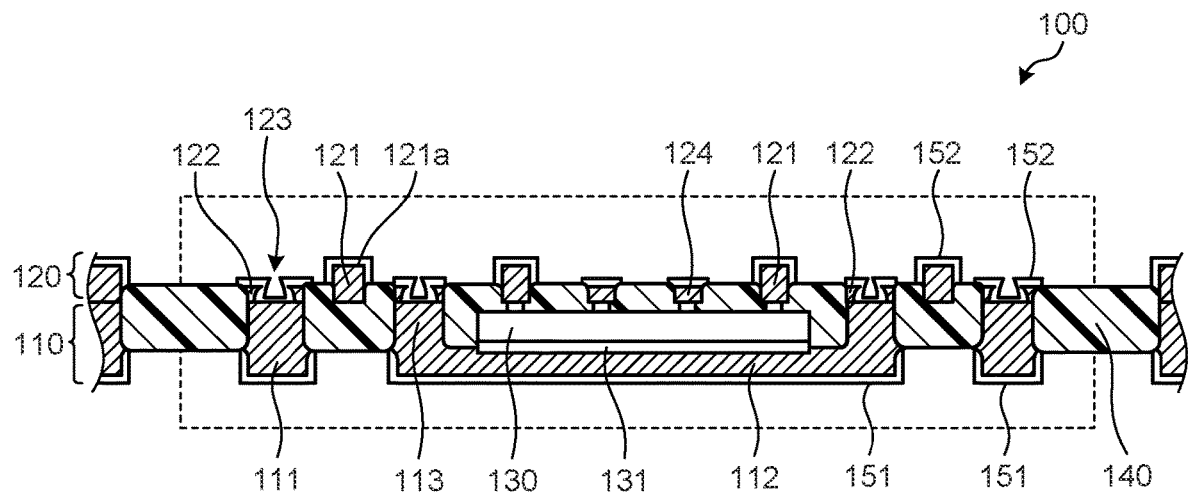
FIG. 1 is a diagram illustrating an example of a configuration of a circuit board according to an embodiment.

FIG. 1 is a diagram illustrating an example of a configuration of a circuit board 100 according to the embodiment. FIG. 1 schematically illustrates a cross section of the circuit board 100. In the circuit board 100 illustrated in FIG. 1, the unit surrounded by a dotted line is repeatedly arrayed and formed in the left and right directions in FIG. 1. The unit surrounded by the dotted line is a unit into which the circuit board 100 is to be divided as an individual electronic device after an external part, such as an inductor, is mounted on the circuit board 100. The embodiment will be described below, using the unit surrounded by the dotted line as an example of the circuit board 100. The number of the units surrounded by the dotted line is not particularly limited.

In the following description, a surface of the circuit board 100 on which an external part is mounted is described as a surface on an upper side (upper surface); however, the circuit board 100 may be manufactured and used, for example, in a vertically flipped manner and may be manufactured and used in a given posture.

The circuit board 100 includes a first part 130, such as an IC (Integrated Circuit) chip, between a first metal layer 110 and a second metal layer 120 and is configured by sealing the first metal layer 110, the second metal layer 120, and the first part 130 with a sealing resin 140. In other words, the space around the first metal layer 110, the second metal layer 120, and the first part 130 is filled with the sealing resin 140. For example, an insulating resin, such as polyimide resin or epoxy resin, or a resin material obtained by mixing fillers, such as silica or alumina, into such resin is usable as the material of the sealing resin 140.

The first metal layer 110 is a layer on which the first part 130 is mounted and on which an external connection terminal that electrically connects the circuit board 100 to another circuit board, or the like, is formed. For example, copper or a copper alloy and steel-nickel alloy, such as 42alloy, is usable as the material of the first metal layer 110. The first metal layer 110 is sometimes referred to as a lead frame.

The first metal layer 110 has a terminal 111 and a pad part 112.

The terminal 111 protrudes from a lower surface of the sealing resin 140 and is used as an external connection terminal that electrically connects the circuit board 100 to another circuit board, or the like. The base of the terminal 111 is positioned in the sealing resin 140 and makes contact with an interlayer connector 122 that is formed in the second metal layer 120, thereby supporting the second metal layer 120.

The pad part 112 is a part made of a plane metal plate and is arranged on the lower surface of the sealing resin 140. The pad part 112 is exposed from the lower surface of the sealing resin 140. The first part 130 is mounted on an upper surface of the pad part 112. Specifically, an outer edge 113 is formed on the upper face of the pad part 112 and along the circumference of the pad part 112 and the first part 130 is mounted on a mount region that is surrounded by the outer edge 113. The outer edge 113 protrudes from the upper surface of the pad part 112 in a position along the periphery of the pad part 112. The end of the outer edge 113 is positioned in the sealing resin 140 and makes contact with the interlayer connector 122 that is formed in the second metal layer 120, thereby supporting the second metal layer 120. Note that the outer edge 113 may be omitted as appropriate.

The first part 130 is an electronic part obtained by integrating electronic circuits with various functions on a semiconductor and is, for example, an IC chip. A lower surface of the first part 130 is joined to the pad part 112 with a joining material 131. For example, solder, heat transmission paste, a thermal interface material (TIM), or the like, is usable as the joining material 131.

The second metal layer 120 is a layer that holds the first part 130 in an interposed manner between the second metal layer 120 and the first metal layer 110 and on which an electrode pad that is connected to the external part mounted on an upper surface of the circuit board 100 is formed. As in the case of the first metal layer 110, for example, copper or a copper alloy and a steel-nickel alloy, such as 42alloy, is usable as the material of the second metal layer 120. The second metal layer 120 is sometimes referred to as a lead frame.

The second metal layer 120 includes an electrode 121, the interlayer connector 122, and an interconnect 124.

The electrode 121 protrudes from an upper surface of the sealing resin 140 and forms the electrode pad that is connected to the external part (referred to as "second part" as appropriate). The base of the electrode 121 is positioned in the sealing resin 140 and is connected to the interlayer connector 122, the interconnect 124, another interconnect, or the like, in a position on the back side not illustrated in FIG. 1. An end face 121a on which the external part is mountable is formed at the tip of the electrode 121. The electrode 121 is formed in multiple positions in the direction of the plane of the second metal layer 120. For example, the electrodes 121 are formed in positions corresponding to the first part 130 in the direction of the plane of the second metal layer 120 and the bases of the electrodes 121 are connected to the first part 130. The electrodes 121 and the first part 130 are connected by, for example, solder. For example, the electrodes 121 are formed around positions corresponding to the first part 130 in the direction of the plane of the second metal layer 120.

The interlayer connector 122 is a plane part that connects the second metal layer 120 and the first metal layer 110 and is formed in a position where the interlayer connector 122 is adjacent to the electrode 121 in the direction of the plane of the second metal layer 120. For example, the interlayer connector 122 is formed in an outer position with respect to a position between the electrodes 121 that are adjacent to each other in the direction of the plane of the second metal layer 120. A bottom surface of the interlayer connector 122 makes contact with the terminal 111 of the first metal layer 110 and electrically connects the second metal layer 120 and the first metal layer 110. For example, the interlayer connector 122 is formed in the position between the electrodes 121 that are adjacent to each other in the direction of the plane of the second metal layer 120. The bottom surface of the interlayer connector 122 makes contact with the outer edge 113 of the pad part 112 of the first metal layer 110 and electrically connects the second metal layer 120 and the first metal layer 110. An upper surface of the interlayer connector 122 is exposed in a position lower than that of the end face 121a of the electrode 121 from the upper surface of the sealing resin 140. In the embodiment, the upper surface of the interlayer connector 122 is exposed on the same plane as that of the upper surface of the sealing resin 140 lower than the end face 121a of the electrode 121. An opening 123 that penetrates the interlayer connector 122 to the first metal layer 110 is formed at the center of the interlayer connector 122.

Because of the exposure of the upper surface of the interlayer connector 122 in the position lower than that of the end face 121a of the electrode 121 from the upper surface of the sealing resin 140, even when the external part is mounted on the end face 121a of the electrode 121, the external part and the interlayer connector 122 are separated by a given interval. This makes it possible to reduce the possibility that the external part and the interlayer connector 122 would make contact with each other. As a result, it is possible to avoid a short circuit between the interlayer connector 122 and the external part.

Particularly when the external part is mounted on the adjacent electrodes 121, the distance between the position between the electrodes 121 adjacent to each other and the external part is short. For this reason, forming the interlayer connector 122 that is exposed in the position lower than that of the end face 121a of the electrode 121 in the position between the electrodes 121 adjacent to each other makes it possible to effectively inhibit contact between the external part and the interlayer connector 122. As a result, it is possible to avoid a short circuit between the interlayer connector 122 that is formed in the position between the electrodes 121 adjacent to each other and the external part that is mounted on the end faces 121a of the electrodes 121.

The interconnect 124 is formed in a position where the interconnect 124 is adjacent to the electrode 121 in the direction of the plane of the second metal layer 120. For example, the interconnect 124 is formed in an inner position with respect to the position between the electrodes 121 adjacent to each other in the direction of the plane of the second metal layer 120. A lower surface of the interconnect 124 is connected to the first part 130. The interconnect 124 and the first part 130 are connected by, for example, solder. An upper surface of the interconnect 124 is exposed in a position lower than that of the end face 121a of the electrode 121 from the upper surface of the sealing resin 140. In the embodiment, the upper surface of the interconnect 124 is exposed on the same plane as that of the upper surface of the sealing resin 140 lower than the end face 121a of the electrode 121.

Because of the exposure of the upper surface of the interconnect 124 in the position lower than that of the end face 121a of the electrode 121 from the upper surface of the sealing resin 140, even when the external part is mounted on the end faces 121a of the electrodes 121, the external part and the interconnect 124 are separated from each other by a given interval. This makes it possible to reduce the possibility that the external part and the interconnect 124 would make contact with each other. As a result, it is possible to avoid a short circuit between the interconnect 124 and the external part.

A plating layer is formed on the surfaces of the first metal layer 110 and the second metal layer 120 that are not covered with the sealing resin 140 and are exposed. For example, a plating layer 151 is formed on a lower surface of the terminal 111, part of a side surface of the terminal 111, a lower surface of the pad part 112, and part of a side surface of the pad part 112. A plating layer 152 is formed on the end face 121a of the electrode 121, part of a side surface of the electrode 121, the upper surface of the interlayer connector 122, and the upper surface of the interconnect 124. The plating layer 152 that is formed on the upper surface of the interlayer connector 122 is formed also in the opening 123 of the interlayer connector 122.

Figure 2:
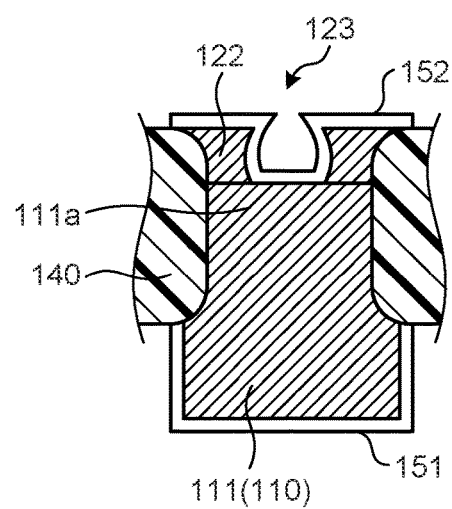
FIG. 2 is a diagram illustrating an example of a position in which a plating layer is formed near an opening of an interlayer connector.

With reference to FIG. 2, the position in which the plating layer 152 is formed near the opening 123 of the interlayer connector 122 will be described in detail here. FIG. 2 is a diagram illustrating an example of the position in which the plating layer 152 is formed near the opening 123 of the interlayer connector 122. FIG. 2 illustrates the interlayer connector 122 making contact with the terminal 111 of the first metal layer 110 as an example. The opening 123 penetrating the interlayer connector 122 to the terminal 111 of the first metal layer 110 is formed at the center of the interlayer connector 122 illustrated in FIG. 2. An end face of the base 111a of the terminal 111 corresponds to an upper surface of the first metal layer 110. The plating layer 152 is formed on the upper surface of the interlayer connector 122, an inner surface of the opening 123, and the end face of the base 111a of the terminal 111 that is exposed in the opening 123. The plating layer 152 covers the upper surface of the interlayer connector 122, the inner surface of the opening 123, and the end face of the base 111a of the terminal 111 that is exposed in the opening 123, thereby joining the interlayer connector 122 to the first metal layer 110. Joining the interlayer connector 122 to the first metal layer 110 makes it possible to increase joint strength between the second metal layer 120 and the first metal layer 110 and, as a result, increase reliability of connection between the first metal layer 110 and the second metal layer 120.

Configuration of Electronic Device

Figure 3:
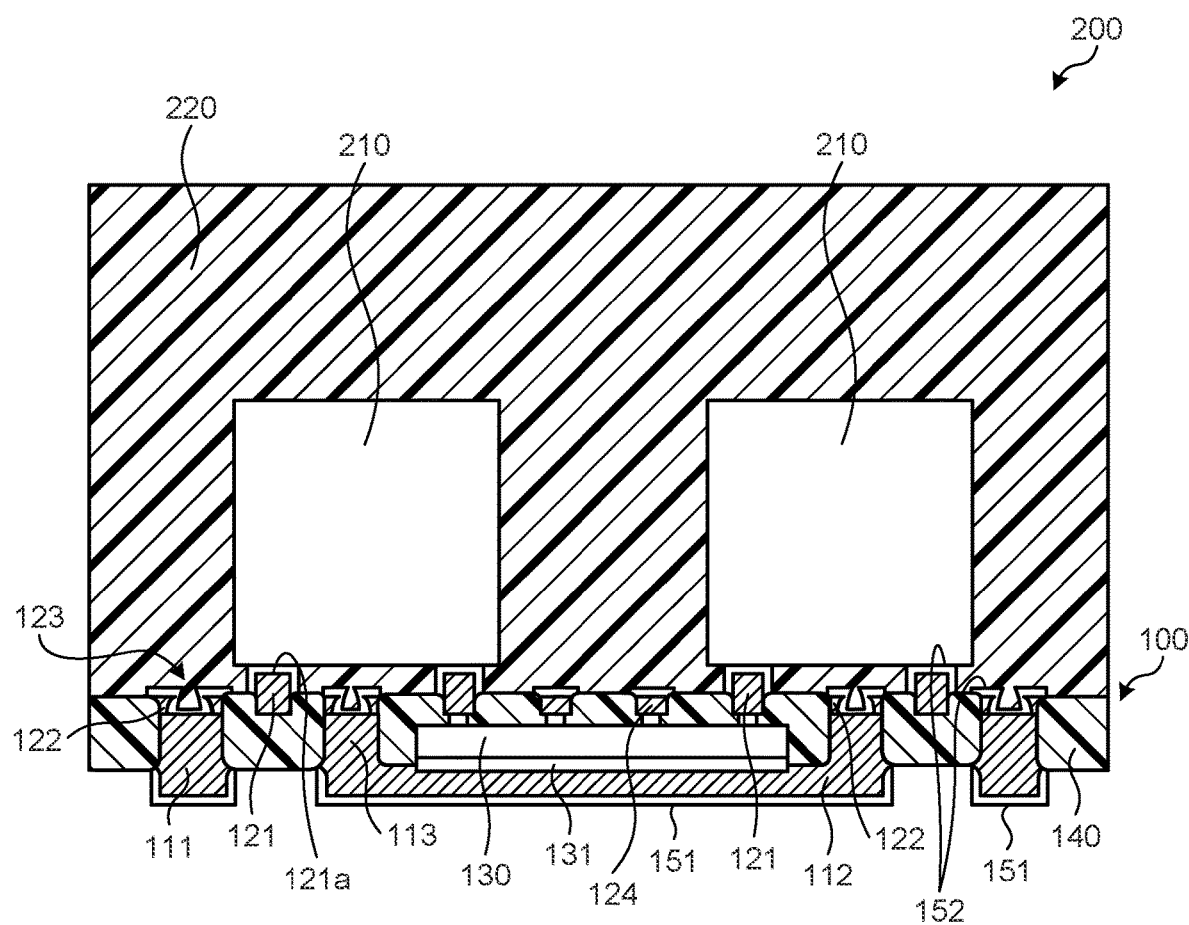
FIG. 3 is a diagram illustrating an example of a configuration of an electronic device that is manufactured using the circuit board according to the embodiment.

FIG. 3 is a diagram illustrating an example of a configuration of an electronic device 200 that is manufactured using the circuit board 100 according to the embodiment. FIG. 3 schematically illustrates a cross-section of the electronic device 200. As illustrated in FIG. 3, the electronic device 200 includes the circuit board 100, a second part 210 that is mounted on the circuit board 100, and a sealing resin 220 that covers the second part 210. The circuit board 100 includes the first metal layer 110, the second metal layer 120, and the sealing resin 140.

The second part 210 is an external part, such as an inductor, and is mounted on the electrodes 121 of the second metal layer 120 that are adjacent to each other. The interlayer connector 122 lower than the end faces 121a of the electrodes 121 is formed in the position between the adjacent electrodes 121 and thus the second part 210 on the end faces 121a of the electrodes 121 and the interlayer connector 122 are separated from each other by a given interval. This inhibits the second part 210 and the interlayer connector 122 from making contact and resultantly avoids a short circuit between the second part 210 and the interlayer connector 122.

The sealing resin 220 is formed on the sealing resin 140 such that the sealing resin 220 covers the second part 210, thereby sealing the second part 210.

Method of Manufacturing Circuit Board

Figure 4:
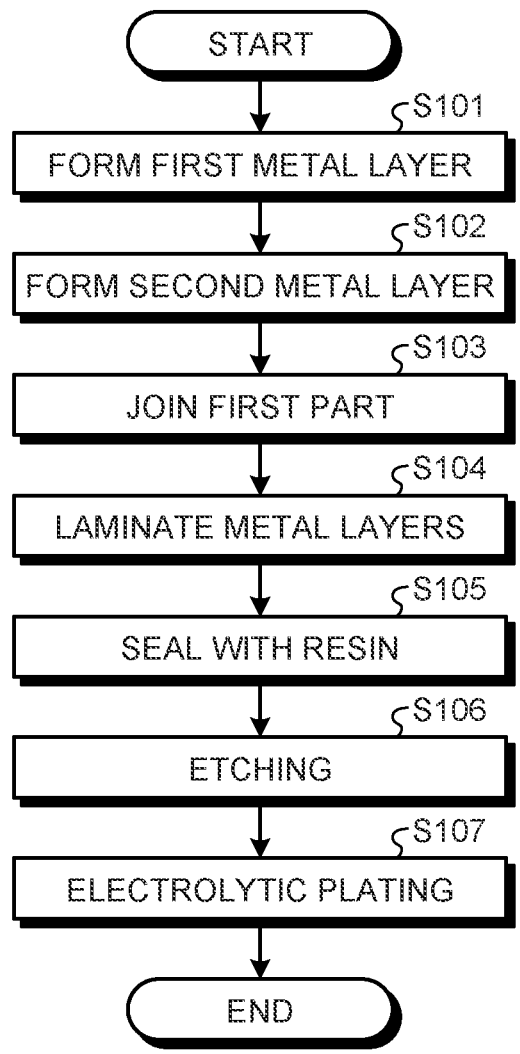
FIG. 4 is a flowchart illustrating an example of a method of manufacturing a circuit board according to the embodiment.

With reference to the flowchart of FIG. 4, a method of manufacturing the circuit board 100 according to the embodiment will be described, taking an example specifically. FIG. 4 is a flowchart illustrating an example of the method of manufacturing the circuit board 100 according to the embodiment.

Figure 5:
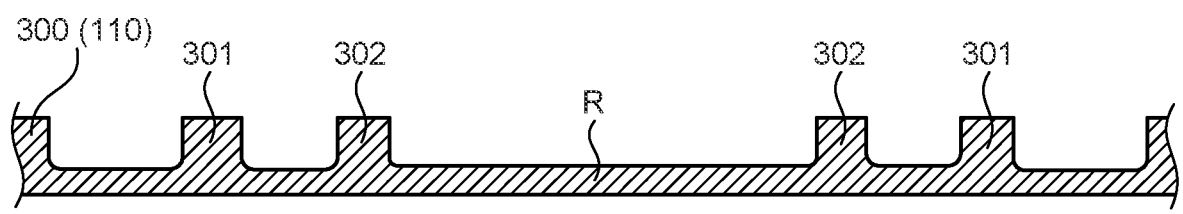
FIG. 5 is a diagram illustrating a specific example of a first metal layer forming step.

First of all, the first metal layer 110 and the second metal layer 120 serving as a frame of the circuit board 100 are formed (steps S101 and S102). Each of the first metal layer 110 and the second metal layer 120 is formed by etching a metal plate. Specifically, as illustrated in FIG. 5, the first metal layer 110 is formed by dissolving, by etching, a first metal plate 300 such that a mount area R on which the first part 130 is mountable, a protrusion 301, and a protrusion 302 surrounding the mount area R are left. FIG. 5 is a diagram illustrating a specific example of a first metal layer forming step. The protrusion 301 is formed in a position in which the terminal 111 is to be formed. The protrusion 302 is formed in a position in which the outer edge 113 of the pad part 112 is to be formed.

Figure 6:
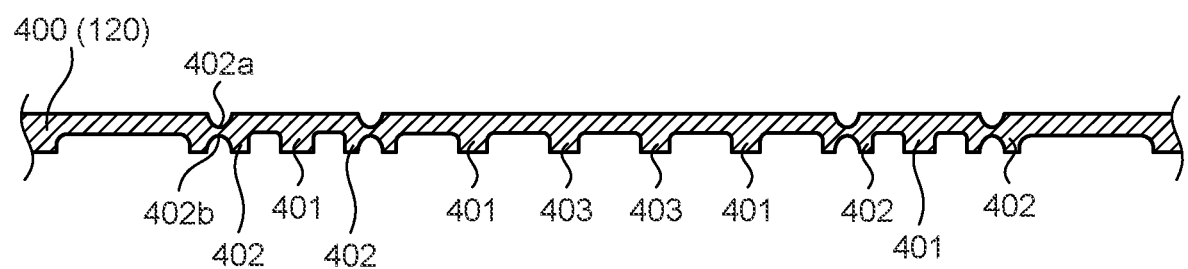
FIG. 6 is a diagram illustrating a specific example of a second metal layer forming step.

For example, as illustrated in FIG. 6, the second metal layer 120 is formed by dissolving, by etching, a second metal plate 400 such that a plurality of first protrusions 401, a plurality of second protrusions 402, and a plurality of third protrusions 403 that are formed in positions adjacent to the first protrusions 401 are left. Concaves 402a and 402b that do not communicate are formed on both end faces of each of the second protrusions 402 by half-etching. FIG. 6 is a diagram illustrating a specific example of a second metal layer forming step. The first protrusions 401 are formed in positions in which the electrodes 121 are to be formed. The second protrusions 402 are formed in positions in which the interlayer connector 122 is to be formed. The third protrusion 403 is formed in a position in which the interconnect 124 is to be formed.

Figure 7:
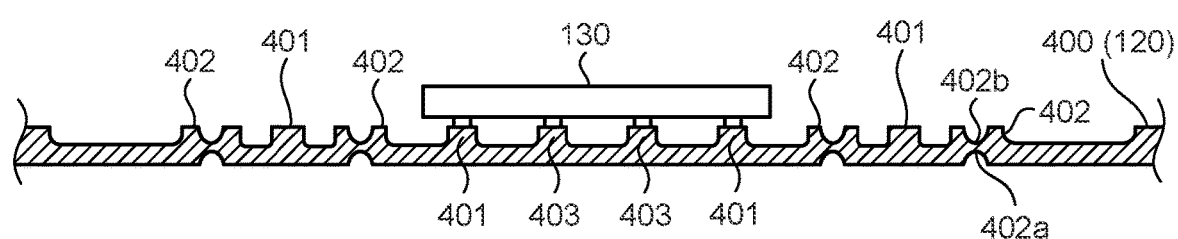
FIG. 7 is a diagram illustrating a specific example of a first part joining step.

After the first metal layer 110 and the second metal layer 120 are formed by etching metal plates, the first part 130 is joined to some of the first protrusions 401 and the third protrusions 403 (step S103). Specifically, for example, as illustrated in FIG. 7, the first part 130 is joined to the first protrusions 401 corresponding to the electrodes 121 that are connected to the first part 130 from among the first protrusions 401 and the third protrusions 403. FIG. 7 is a diagram illustrating a specific example of a first part joining step. The first part 130 is joined to the first protrusions 401 and the third protrusions 403 with solder.

Figure 8:
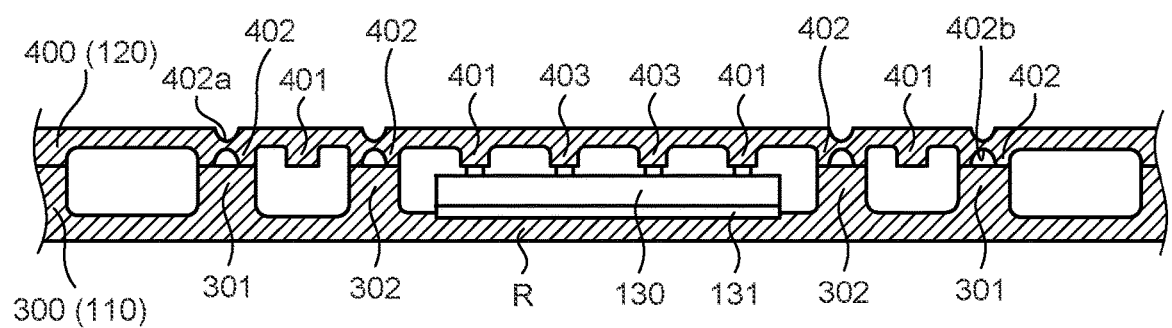
FIG. 8 is a diagram illustrating a specific example of a metal layer laminating step.

After the first part 130 is joined to some of the first protrusions 401 and the third protrusions 403 of the second metal layer 120, the second metal layer 120 is laminated on the first metal layer 110 (step S104). In other words, the second metal layer 120 is laminated on the first metal layer 110 such that the first part 130 is joined to the mount area R by the joining material 131 and the second protrusions 402 make contact with the protrusions 301 and 302. Accordingly, for example, as illustrated in FIG. 8, an intermediate structure in which the first metal layer 110 and the second metal layer 120 sandwiches the first part 130 is formed. FIG. 8 is a diagram illustrating a specific example of a metal laminating step.

Figure 9:
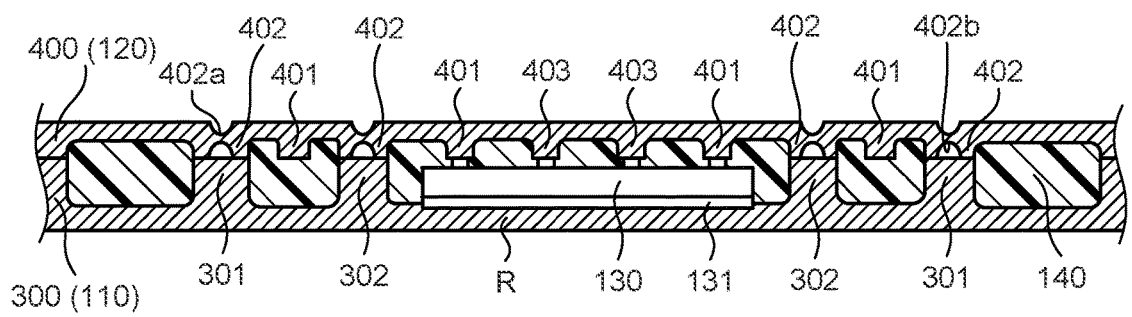
FIG. 9 is diagram illustrating a specific example of a resin sealing step.

The intermediate structure is sealed with resin by, for example, a transfer mold technique (step S105). In other words, after the intermediate structure is set in the cavity of a metal mold and an uncured sealing resin 140 is injected into the cavity of the metal mold, the sealing resin 140 is heated and cures. As a resin sealing method, for example, a compression mold technique or an injection mold technique may be used other than the transfer mold technique. Sealing the intermediate structure with resin fills the space between the first metal layer 110 and the second metal layer 120 with the sealing resin as illustrated in FIG. 9, thereby sealing the first part 130. FIG. 9 is a diagram illustrating a specific example of the resin sealing step.

Figure 10:
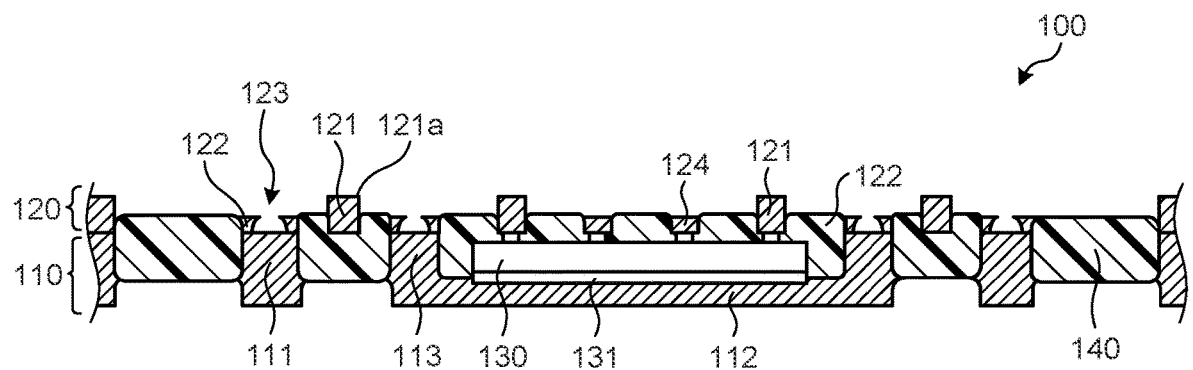
FIG. 10 is a diagram illustrating a specific example of an etching step.

After the intermediate structure is sealed with resin, etching is performed on the first metal layer 110 and the second metal layer 120 (step S106). Specifically, for example, given regions of the first metal layer 110 that do not overlap the first part 130 and the protrusions 301 and 302 are etched, so that the terminal 111, the pad part 112 and the outer edge 113 are formed. In other words, for example, as illustrated in FIG. 10, the terminal 111 is formed in the position of the protrusion 301 and the pad part 112 and the outer edge 113 are formed in the positions of the first part 130 and the protrusion 302.

For example, a given region of the second metal layer 120 that does not overlap the first protrusions 401 is etched, so that the electrode 121, the interlayer connector 122, and the interconnect 124 are formed. In other words, for example, as illustrated in FIG. 10, the electrode 121 is formed in the position of each of the first protrusions 401, the interlayer connector 122 is formed in the position of each of the second protrusions 402, and the interconnect 124 is formed in the position of the third protrusion 403. In the position of the concaves 402a and 402b that are formed on both the end faces of each of the second protrusions 402, the concave 402a and the concave 402b communicate because of etching from the side of the concave 402a, so that the opening 123 is formed. FIG. 10 illustrates a specific example of an etching step.

As described above, simultaneously with formation of the terminal 111, the pad part 112, and the outer edge 113 in the first metal layer 110 by etching, the electrode 121, the interlayer connector 122, and the interconnect 124 are formed in the second metal layer 120. In the second metal layer 120, because of etching that causes the concave 402a and the concave 402b to communicate, the opening 123 that penetrates the interlayer connector 122 to the upper surface of the first metal layer 110 is formed.

The upper surface of the interlayer connector 122 that is formed by etching is exposed in the position lower than that of the end face 121a of the electrode 121 from the upper surface of the sealing resin 140. This makes it possible to ensure a difference of a given height between the end face 121a on which the second part 210 is mountable and the upper surface of the interlayer connector 122. As a result, even when the second part 210 is mounted on the end faces 121a of the electrodes 121, it is possible to reduce the possibility of contact between the second part 210 and the interlayer connector 122 and thus avoid a short circuit.

The upper surface of the interconnect 124 that is formed by etching is exposed in a position lower than that of the end face 121a of the electrode 121 from the upper surface of the sealing resin 140. This makes it possible to ensure a difference of a given height between the end face 121a on which the second part 210 is mountable and the upper surface of the interconnect 124. As a result, even when the second part 210 is mounted on the end faces 121a of the electrodes 121, it is possible to reduce a possibility of contact between the second part 210 and the interconnect 124 and thus avoid a short circuit.

After the etching completes, electrolytic plating is performed on a metal region that is exposed to the outside of the sealing resin (step S107). Specifically, power is supplied from the side of the first metal layer 110 or the side of the second metal layer 120 and thus electrolytic plating is performed on the surface of the entire intermediate structure. Accordingly, a plating layer is formed on the metal region of the first metal layer 110 and the second metal layer 120 that is exposed from the sealing resin 140.

Figure 11:
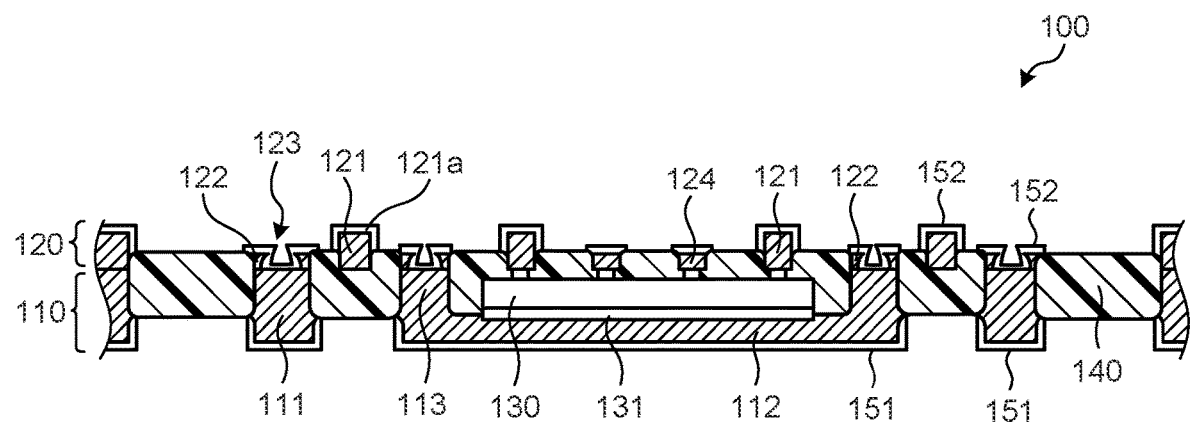
FIG. 11 is a diagram illustrating a specific example of an electrolytic plating step.

In other words, for example, as illustrated in FIG. 11, the plating layer 151 is formed on the lower surface of the terminal 111, part of the side surface of the terminal 111, the lower surface of the pad part 112, and part of the side surface of the pad part 112. The plating layer 152 is formed on the end face 121a of the electrode 121, part of the side surface of the electrode 121, the upper surface of the interlayer connector 122, and the upper surface of the interconnect 124. FIG. 11 is a diagram illustrating a specific example of an electrolytic plating step. As the method of forming the plating layers 151 and 152, PPF (Pre Plated leadFrame), or the like, may be usable in addition to electrolytic plating.

The plating layer 152 is formed on, in addition to the upper surface of the interlayer connector 122, the inner surface of the opening 123 and the end face of the base 111a of the terminal 111 that is exposed in the opening 123. The plating layer 152 covers the upper surface of the interlayer connector 122, the inner surface of the opening 123, and the end face of the base 111a of the terminal 111 that is exposed in the opening 123. As described above, when electrolytic plating is performed on the surface of the entire intermediate structure, the plating layer 152 is formed on the upper surface of the interlayer connector 122, the inner surface of the opening 123, and the end face of the base 111a of the terminal 111 that is exposed in the opening 123. For this reason, the plating layer 152 enables the interlayer connector 122 to be joined to the first metal layer 110. Joining the interlayer connector 122 to the first metal layer 110 makes it possible to increase the joint strength between the second metal layer 120 and the first metal layer 110 and, as a result, increase reliability of connection between the first metal layer 110 and the second metal layer 120.

Method of Manufacturing Electronic Device

Figure 12:
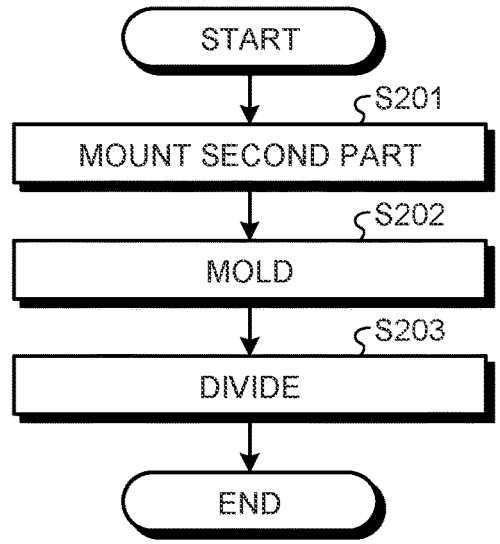
FIG. 12 is a flowchart illustrating an example of a method of manufacturing an electronic device according to the embodiment.

A method of manufacturing the electronic device 200 according to the embodiment will be described, taking an example specifically, with reference to FIG. 12. FIG. 12 is a flowchart illustrating an example of the method of manufacturing the electronic device 200 according to the embodiment.

Figure 13:
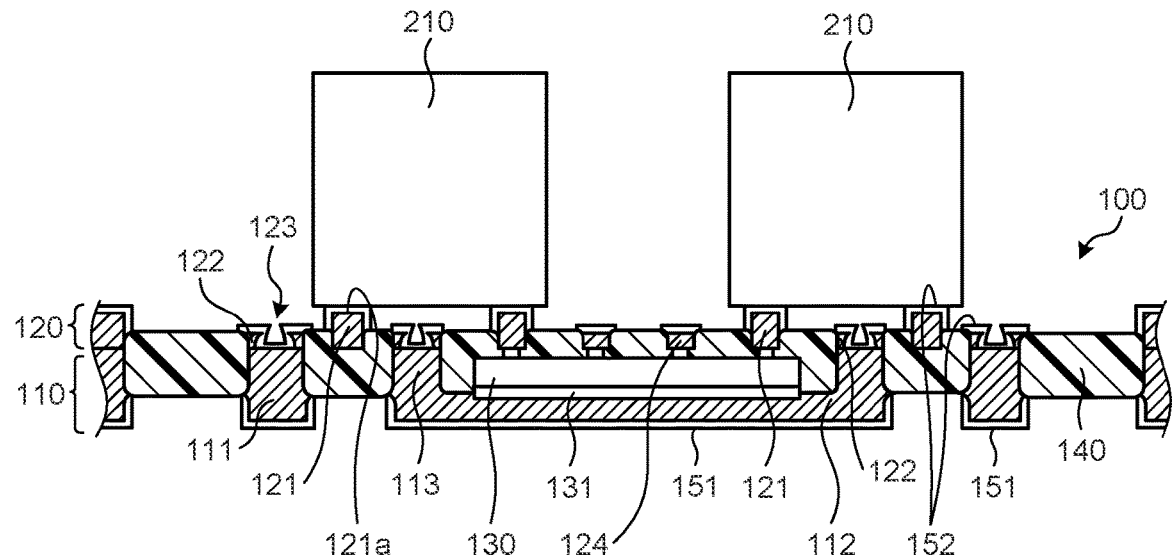
FIG. 13 is a diagram illustrating a specific example of a second part mounting step.

First of all, the second part 210 is mounted on the electrodes 121 of the circuit board 100 (step S201). Specifically, for example, as illustrated in FIG. 13, the second part 210 is joined to the end faces 121a of the electrodes 121 with a joining material, such as solder. The upper surface of the interlayer connector 122 is exposed in the position lower than the end face 121a of the electrode 121 from the upper surface of the sealing resin 140 and thus the second part 210 and the interlayer connector 122 are separated from each other, which makes it possible to join the second part 210 to the electrode 121 without causing a short circuit. Because of exposure of the upper surface of the interconnect 124 in the position lower than that of the end face 121a of the electrode 121 from the upper surface of the sealing resin 140, the second part 210 and the interconnect 124 are separated from each other, which makes it possible to join the second part 210 to the electrode 121 without causing a short circuit. FIG. 13 is a diagram illustrating a specific example of a second part mounting step.

Figure 14:
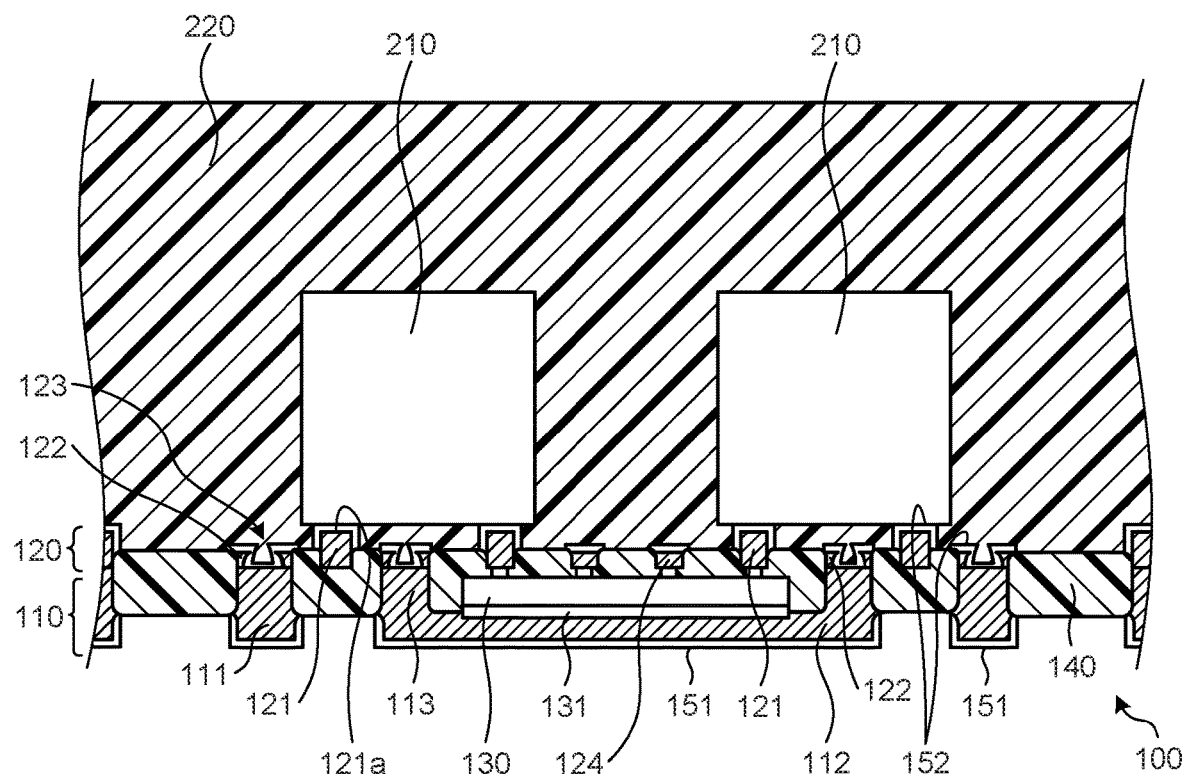
FIG. 14 is a diagram illustrating a specific example of a molding step.

After the second part 210 is joined to the electrodes 121, molding of sealing the second part 210 mounted on the circuit board 100 with the sealing resin is performed (step S202). Specifically, the circuit board 100 with the second part 210 mounted thereon is housed in a metal mold and an uncured sealing resin is injected into the metal mold. The sealing resin is heated to a given temperature and is cured, so that, for example, as illustrated in FIG. 14, the space around the second part 210 is filled with the sealing resin 220 and the second part 210 mounted on the circuit board 100 is sealed. The opening 123 is formed in the interlayer connector 122 and thus the space in the opening 123 is also filled with the sealing resin 220, so that the joint strength between the circuit board 100 and the sealing resin 220 increase. In other words, it is possible to reduce the possibility that the circuit board 100 would drop off the sealing resin 220. FIG. 14 is a diagram illustrating a specific example of a molding step.

Figure 15:
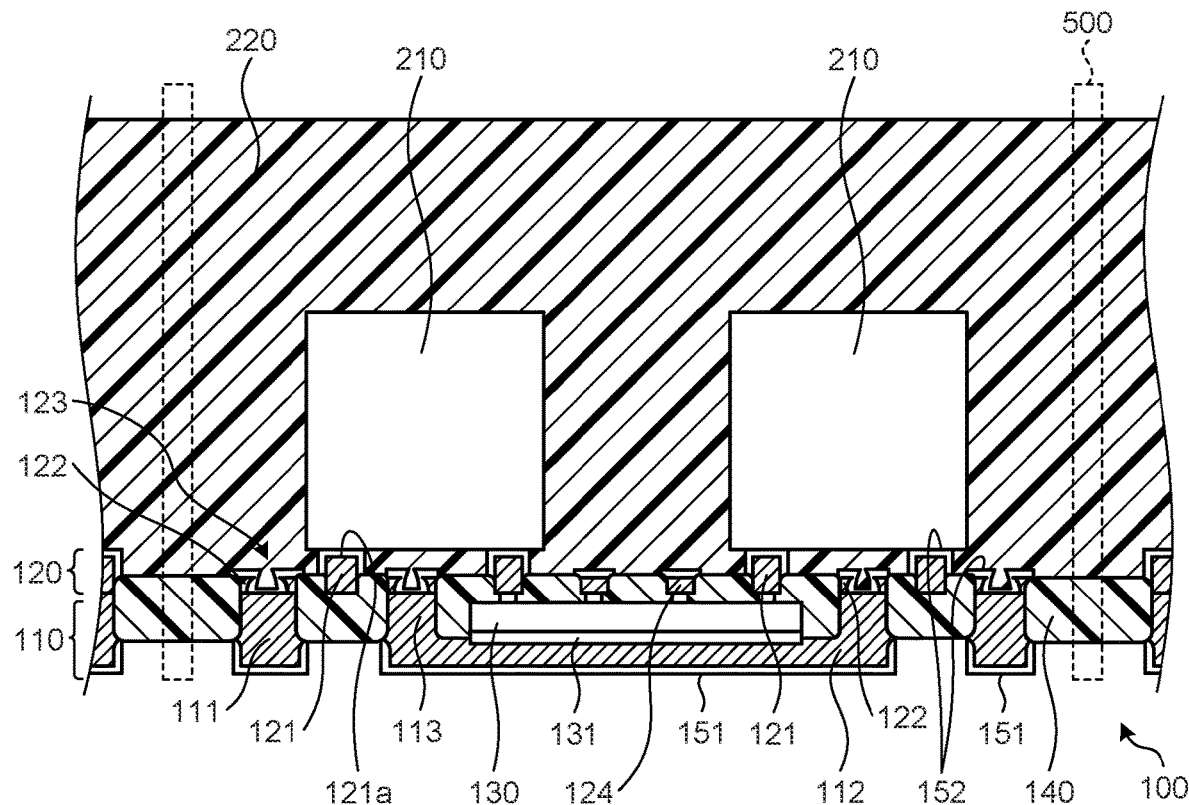
FIG. 15 is a diagram illustrating a specific example of a separating step.

After the second part 210 that is mounted on the circuit board 100 is sealed with the sealing resin 220, the circuit board 100 is divided into pieces (step S203). Specifically, for example, as illustrated in FIG. 15, the sealing resin 220 and the circuit board 100 is cut by blades 500, so that the circuit board 100 is divided into pieces. FIG. 15 is a diagram illustrating a specific example of a dividing process. The circuit board 100 is divided into pieces, so that the electronic device 200 illustrated in FIG. 3 is completed.

As described above, the circuit board (for example, the circuit board 100) according to the embodiment includes a first metal layer (for example, the first metal layer 110), a second metal layer (for example, the second metal layer 120), and a sealing resin (the sealing resin 140). The second metal layer is arranged on the first metal layer. The space between the first metal layer and the second metal layer is filled with a sealing resin. The second metal layer includes an electrode (for example, the electrode 121) and the interlayer connector (for example, the interlayer connector 122). The electrode protrudes from an upper surface of the sealing resin and has an end face (for example, the end face 121a) on which an electronic part is mountable. An upper surface of the interlayer connector is exposed in a position lower than that of the end face of the electrode from the upper surface of the sealing resin from the upper surface of the sealing resin and makes contact with the first metal layer. Accordingly, according to the embodiment, it is possible to avoid a short circuit between the interlayer connector and the external part.

The second metal layer according to the embodiment further includes an opening (for example, the opening 123) and a plating layer (for example, the plating layer 152). The opening penetrates the interlayer connector to an upper surface of the first metal layer. The plating layer is formed on an upper surface of the interlayer connector, an inner surface of the opening, and the upper surface of the first metal layer that is exposed in the opening. According to the embodiment, this makes it possible to increase reliability of connection between layers.

The second metal layer according to the embodiment further includes an interconnect (for example, the interconnect 124). An upper surface of the interconnect is exposed in a position lower than that of the end face of the electrode from the upper surface of the sealing resin. According to the embodiment, this makes it possible to avoid a short circuit between the interconnect and the external part.

The electrode according to the embodiment is formed in a plurality of positions along a direction of a plane of the second metal layer and the interlayer connector is formed in a position between the electrodes that are adjacent to each other. According to the embodiment, this makes it possible to avoid a short circuit between the interlayer connector that is formed in the position between the electrodes that are adjacent to each other and the external part that is mounted on the electrodes that are adjacent to each other.

Modification

Figure 16:
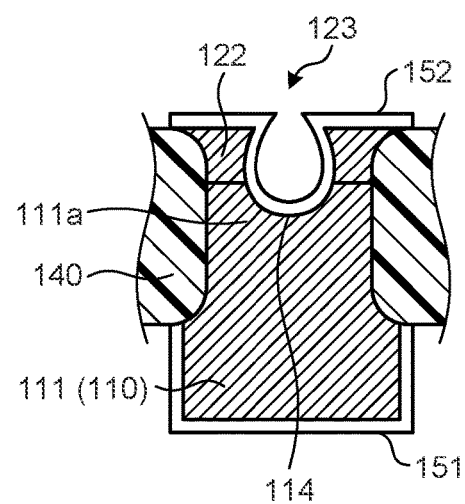
FIG. 16 is a diagram illustrating another example of the position in which a plating layer is formed near the opening of the interlayer connector.

The embodiment represents the case where forming the plating layer 152 on the upper surface of the first metal layer 110 (for example, the end face of the base 111a of the terminal 111) that is exposed in the opening 123 increases reliability of connection between the second metal layer 120 and the first metal layer 110. The plating layer 152 however may be formed in a position lower than the upper surface of the first metal layer 110. With reference to FIG. 16, another example of the position in which the plating layer 152 is formed will be described.

FIG. 16 is a diagram illustrating another example of the position in which the plating layer 152 is formed near the opening 123 of the interlayer connector 122. FIG. 16 illustrates the interlayer connector 122 that makes contact with the terminal 111 of the first metal layer 110 as an example. The opening 123 that penetrates the interlayer connector 122 to the terminal 111 of the first metal layer 110 is formed at the center of the interlayer connector 122 illustrated in FIG. 16. The end face of the base 11a of the terminal 111 corresponds to the upper surface of the first metal layer 110. A concave 114 that communicates with the opening 123 and that sinks to a position lower that of the end face of the base 111a is formed in the end face of the base 111a of the terminal 111. The plating layer 152 is formed on the upper surface of the interlayer connector 122, the inner surface of the opening 123, and the inner wall surface of the concave 114. Covering the upper surface of the interlayer connector 122, the inner surface of the opening 123, and the inner wall surface of the concave 114 with the plating layer 152 enables the interlayer connector 122 to be joined to the first metal layer 110. The inner wall surface of the concave 114 is a curved surface having a larger surface area than that of a flat surface and thus forming the plating layer 152 on the inner wall surface of the concave 114 makes it possible to increase the area covered with the plating layer 152 compared to the case where the plating layer 152 is formed on the end face of the base 111a. As a result, the area covered with the plating layer 152 that joins the interlayer connector 122 and the first metal layer 110 increases and it is possible to further increase the reliability of connection between the first metal layer 110 and the second metal layer 120. The concave 114 is formed, for example, in the etching step (step S106) in FIG. 4 by performing over etching to a position lower than that of the upper surface of the first metal layer 110.

As described above, forming the plating layer 152 on the upper surface of the interlayer connector 122, the inner wall surface of the opening 123, and the inner wall surface of the concave 114 makes it possible to increase reliability of connection between the first metal layer 110 and the second metal layer 120.

Figure 17:
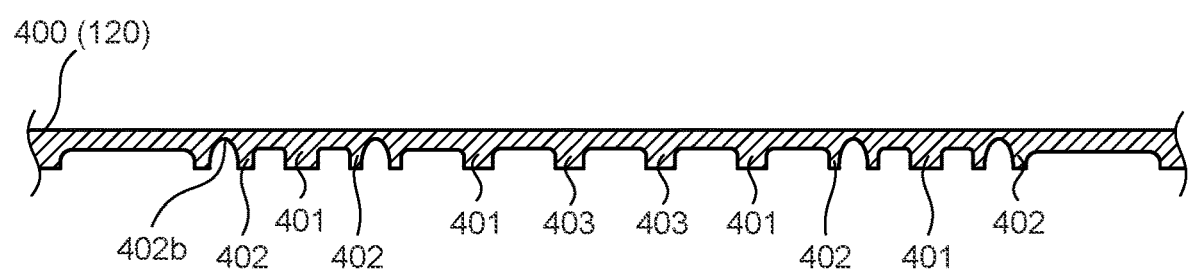
FIG. 17 is a diagram illustrating another specific example of the second metal layer forming step.

In the embodiment described above, when the second metal layer 120 having the second protrusions 402 is formed, the concaves 402a and 402b are formed on both end faces of each of the second protrusions 402; however, formation of the concave 402a on the end face of each of the second protrusions 402 on the base end side may be omitted. FIG. 17 is a diagram illustrating another specific example of the second metal layer forming step. In other words, for example, as illustrated in FIG. 17, when the second metal layer 120 is formed, the concave may be not formed on the end face of each of the second protrusions 402 on the base end side and the concave 402b may be formed by half-etching only on the end face of each of the second protrusions 402 on the leading end side. In this case, in view of ensured formation of the opening 123 in the position of the concave 402b in the following etching, it is preferable that the concave 402b be deeper than other concaves positioned around each of the second protrusions 402 and around other protrusions.

When the concave 402b is formed only on the end face of each of the second protrusions 402 on the leading end side, basically, etching on the second metal layer 120 is performed as in the above-described embodiment (step S106). In other words, a given region in the second metal layer 120 not overlapping the first protrusions 401 is etched, so that the electrode 121, the interlayer connector 122, and the interconnect 124 are formed. The opening 123 is formed in the position of the concave 402b by etching from the leading end side of each of the second protrusions 402.

In the embodiment described above, a metal thinner than the first metal layer 110 may be used for the second metal layer 120. The second metal layer 120 is directly connected to the first part 130 and thus fine interconnecting is required compared to the first metal layer 110. Etching that is performed to form interconnects, in general, proceeds isotopically and thus the amount of etching in a thickness direction is equal to the amount of etching in the horizontal direction. Thus, it is preferable that the second metal layer 120 requiring fine interconnecting be thin because a smaller etching amount in the thickness direction only requires a short distance between interconnects in the horizontal direction. On the other hand, it is preferable that the first metal layer 110 containing the pad part 112 incorporating the first part 130 be thick.

Figure 18:
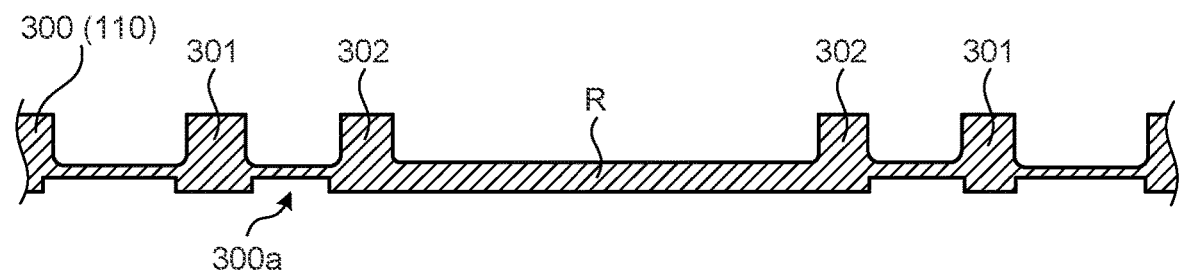
FIG. 18 is a diagram illustrating another specific example of the first metal layer forming step.

When the first metal layer 110 is thicker than the second metal layer 120, interconnects in the first metal layer 110 and the second metal layer 120, etc., be formed in the same etching time. For this reason, when the first metal layer 110 is formed, the region to be etched may be formed thinner than other regions. FIG. 18 is a diagram illustrating another specific example of the first metal layer forming step. In other words, for example, as illustrated in FIG. 18, when the first metal layer 110 is formed, the first metal plate 300 may be partially made thin by forming a concave 300a by half-etching in the region to be etched.

Figure 19:
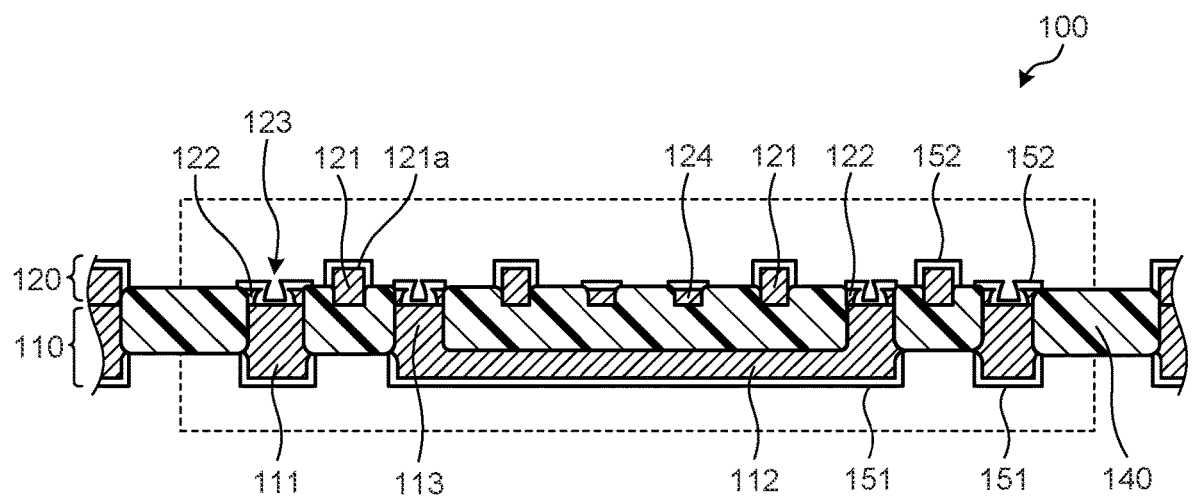
FIG. 19 is a diagram illustrating another example of a configuration of the circuit board according to the embodiment.

In the embodiment described above, for example, as illustrated in FIG. 19, the first part 130 may be omitted. FIG. 19 is a diagram illustrating another example of a configuration of the circuit board 100 according to the embodiment.

According to a mode of the circuit board disclosed herein, an effect that it is possible to avoid a short circuit between the interlayer connector and the external part is achieved.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

Note (1) A method of manufacturing a circuit board comprising:
  forming a first metal layer;
  forming a second metal layer including a plurality of first protrusions and a plurality of second protrusions;
  laminating the second metal layer on the first metal layer such that the second protrusions of the second metal layer make contact with the first metal layer;
  filling a space between the first metal layer and the second metal layer with a sealing resin; and
  forming an electrode that protrudes from the sealing resin and that has an end face on which an electronic part is mountable in a position of each of the first protrusions by etching a region of the second metal layer not overlapping the first protrusions and forming an interlayer connector that makes contact with the first metal layer and whose upper surface is exposed in a position lower than that of the end face of the electrode from the sealing resin in a position of each of the second protrusions.

(2) The method according to the note (1), wherein the forming the second metal layer includes forming a second metal layer in which a concave is formed in both end faces of each of the second protrusions or in one of the end faces on a leading end side; and
  the etching includes
  forming an opening that penetrates to an upper surface of the first metal layer in the interlayer connector in a position of the concave; and
  forming a plating layer on an upper surface of the interlayer connector, an inner surface of the opening, and the upper surface of the first metal layer that is exposed in the opening.

(3) The method according to the note (1), further comprising, after the forming the second metal layer, joining another electronic part on some of the first protrusions of the second metal layer;
  wherein the laminating the second metal layer on the first metal layer includes arranging the other electronic part between the first metal layer and the second metal layer, and the filling the space with the sealing resin includes covering the other electronic part with the sealing resin.

(4) The method according to the note (3), wherein the forming the first metal layer includes forming the first metal layer by etching a first metal plate, the forming the second metal layer includes forming the second metal layer by etching a second metal plate, and the second metal plate has a thickness smaller than that of the first metal plate.

What is claimed is:

1. A circuit board comprising:
a first metal layer;
a second metal layer that is arranged on the first metal layer; and
a sealing resin with which a space between the first metal layer and the second metal layer is filled,
wherein the second metal layer includes:
an electrode that protrudes from an upper surface of the sealing resin and that has an end face on which an electronic part is mountable;
an interlayer connector whose upper surface is exposed in a position lower than the end face of the electrode from the upper surface of the sealing resin and that makes contact with the first metal layer;
an opening that penetrates the interlayer connector to an upper surface of the first metal layer; and
a plating layer that is formed on the upper surface of the interlayer connector, an inner surface of the opening, and the upper surface of the first metal layer that is exposed in the opening,
the first metal layer includes a concave that communicates with the opening and that sinks to a position lower than the upper surface of the first metal layer, and
the plating layer is formed on the upper surface of the interlayer connector, the inner surface of the opening, and an inner wall surface of the concave.

2. The circuit board according to claim 1, wherein the second metal layer further includes, separately from the interlayer connector, an interconnect whose upper surface is exposed in a position lower than the end face of the electrode from the upper surface of the sealing resin.

3. The circuit board according to claim 1, wherein another electronic part that is electrically connected to the second metal layer is arranged between the first metal layer and the second metal layer and the other electronic part is covered with the sealing resin.

4. An electronic device comprising:
a circuit board;
an electronic part that is mounted on the circuit board; and
a first sealing resin that covers the electronic part,
wherein the circuit board includes
a first metal layer;
a second metal layer that is arranged on the first metal layer; and
a second sealing resin with which a space between the first metal layer and the second metal layer is filled, and
the second metal layer includes:
an electrode that protrudes from an upper surface of the second sealing resin and that has an end face on which the electronic part is mountable;
an interlayer connector whose upper surface is exposed in a position lower than the end face of the electrode from the upper surface of the second sealing resin and that includes an interlayer connector that makes contact with the first metal layer;
an opening that penetrates the interlayer connector to an upper surface of the first metal layer; and
a plating layer that is formed on the upper surface of the interlayer connector, an inner surface of the opening, and the upper surface of the first metal layer that is exposed in the opening,
the first metal layer includes a concave that communicates with the opening and that sinks to a position lower than the upper surface of the first metal layer, and
the plating layer is formed on the upper surface of the interlayer connector, the inner surface of the opening, and an inner wall surface of the concave.

* * * * *